(12) United States Patent
Cordoba Matilla

(10) Patent No.: US 8,552,846 B2
(45) Date of Patent: Oct. 8, 2013

(54) METHOD AND APPARATUS FOR DRIVING A DIELECTRIC ELASTOMER MATRIX AVOIDING CROSSTALK

(75) Inventor: José Luis Cordoba Matilla, Madrid (ES)

(73) Assignee: Vision Tactil Portable, S.L., Madrid (ES)

( * ) Notice: Subject to any disclaimer, the term of this patent is extended or adjusted under 35 U.S.C. 154(b) by 0 days.

(21) Appl. No.: 13/514,021

(22) PCT Filed: Jan. 22, 2010

(86) PCT No.: PCT/ES2010/000019
§ 371 (c)(1),
(2), (4) Date: Jun. 5, 2012

(87) PCT Pub. No.: WO2011/089274
PCT Pub. Date: Jul. 28, 2011

(65) Prior Publication Data
US 2012/0242645 A1  Sep. 27, 2012

(51) Int. Cl.
*H04B 3/36* (2006.01)
*G09G 3/00* (2006.01)
*G09G 3/34* (2006.01)

(52) U.S. Cl.
USPC .......................... 340/407.1; 345/30; 345/212

(58) Field of Classification Search
USPC ............ 340/212, 407.1; 345/30, 212; 341/26
See application file for complete search history.

(56) References Cited

U.S. PATENT DOCUMENTS 6,166,725 A * 12/2000 Isami et al. ............... 345/209
6,326,936 B1 * 12/2001 Inganas et al. ............. 345/55
8,264,384 B2 * 9/2012 Tsao et al. .................. 341/26
2001/0026121 A1 * 10/2001 Khan et al. ................ 313/483
2004/0017302 A1 * 1/2004 Yu ............................. 341/22
2004/0021620 A1 * 2/2004 Mikami et al. ............ 345/30
2005/0173231 A1   8/2005 Gonzales (Continued)

FOREIGN PATENT DOCUMENTS

WO  WO 2009/037379  3/2009

OTHER PUBLICATIONS

International Search Reprot for International Application No. PCT/ES2010/000019 mailed Sep. 23, 2010.

(Continued)

*Primary Examiner* — Hai Phan
*Assistant Examiner* — Royit Yu
(74) *Attorney, Agent, or Firm* — Merchant & Gould P.C.

(57) ABSTRACT

A method for driving a matrix of elements responding to the absolute value of the activation voltage avoiding crosstalk, the matrix (4) composed of elements (3) arranged in M rows and N columns with a first (2) and second (2') electrodes to apply the activation voltage. When elements ($E_{3C}, E_{6C}, E_{8C}$) located on a common activation column ($C_C$) and on activation rows ($R_3, R_6, R_8$) are to be excited, the method including applying a row activation voltage (V3) to the first electrode (2) of the elements (3) located on activation rows ($R_3, R_6, R_8$); applying a column activation voltage (V0) to the second electrode (2') of the elements (3) located on common activation column (C); applying a common row voltage (V1) to the first electrode (2) of the elements (3) located on all the rows of the matrix (4) except for the activation rows ($R_3, R_6, R_8$); applying a common column voltage (V2) to the second electrode (2') of the elements (3) located on all the columns of the matrix (4) except for the common activation column (C).

13 Claims, 13 Drawing Sheets

(56) References Cited

U.S. PATENT DOCUMENTS

| | | | |
|---|---|---|---|
| 2005/0264472 A1* | 12/2005 | Rast | 345/30 |
| 2006/0033693 A1* | 2/2006 | Sako et al. | 345/87 |
| 2007/0002007 A1* | 1/2007 | Tam | 345/105 |
| 2007/0031097 A1* | 2/2007 | Heikenfeld et al. | 385/129 |
| 2008/0024328 A1* | 1/2008 | Lim | 341/22 |
| 2008/0122589 A1 | 5/2008 | Ivanov et al. | |
| 2008/0316067 A1* | 12/2008 | Siepmann | 341/26 |
| 2009/0040414 A1* | 2/2009 | Kawachi | 349/48 |
| 2009/0135030 A1* | 5/2009 | Ron et al. | 341/26 |
| 2009/0174671 A1 | 7/2009 | Tachi et al. | |
| 2010/0040966 A1* | 2/2010 | Gu et al. | 430/37 |
| 2010/0163875 A1* | 7/2010 | Huitema et al. | 257/59 |

OTHER PUBLICATIONS

Heydt et al. "P-7.5: Refreshable Braille Display Based on Electroactive Polymers." *Proc. 23$^{rd}$. Intl. Display Res. Con*. Sep. 2003. pp. 15-18.

Kornbluh et al. "Electroelastomers: Applications of Dielectric Elastomer Transducers for Actuations, Generation and Smart Structures." *Proceedsing of SPIE* vol. 4698. 2002. pp. 254-270.

Perline et al. "High-Speed Electrically Actuated Elastomers with Strain Greater Than 100%." *Science* vol. 287. 2000. pp. 836-839.

Prahlad et al. "Programable surface deformation: thickness-mode electroactive polymer actuators and their applications." *Proceedings of SPIE* vol. 5759. 2005. pp. 102-113.

\* cited by examiner

METHOD AND APPARATUS FOR DRIVING A DIELECTRIC ELASTOMER MATRIX AVOIDING CROSSTALK

This application is a National Stage Application of PCT/ES2010/000019, filed 22 Jan. 2010, and which application is incorporated herein by reference. To the extent appropriate, a claim of priority is made to the above disclosed application.

FIELD OF THE INVENTION

The present invention relates to a technique for driving a passive matrix, such as an elastomer matrix, that responds to the magnitude of the excitation voltage, this is, the matrix individual elements respond in the same way to an excitation voltage of +V or −V volts.

The elastomer matrix driven by the present method and apparatus can be applied, for instance, to generate tactile visual images in a tactile visual system, such as the tactile visual system disclosed in Spanish patent application No. 200900991.

BACKGROUND OF THE INVENTION

Matrix are addressee by coincident selection of an element, such as pixel for displays or taxel (a taxel is a tactile pixel, a tactile element) for actuators, at the intersection of a given row and column. Multiplexing is the term applied to the time division whereby the pixels are excited or driven. Problems arise when driving large matrix. With a large matrix, if the electro-optical display elements are electrically linear, crosstalk (noise in the form of unwanted excitation of unselected pixels) limits the size of the matrix.

It is object of the present invention to provide a passive matrix driving scheme which has a very high signal-to noise (S/N) ratio for driving large matrixes of linear elements.

BIBLIOGRAPHIC REFERENCES

[1] R. Pelrine, R. Kornbluh, Q. Pei, and J. Joseph, "*High-Speed Electrically Actuated Elastomers with Over 100% Strain*", Science, Vol. 287, No. 5454, pp. 836-839, 2000.
[2] R. Kornbluh, R. Pelrine, Q. Pei, R. Heydt, S. Stanford, S. Oh, and J. Eckerle, "*Electroelastomers: Applications of Dielectric Elastomer Transducers for Actuation, Generation and Smart Structures*", Smart Structures and Materials 2002: *Industrial and Commercial Applications of Smart Structures Technologies*, ed. A. McGowan, Proc. SPIE, Vol. 4698, pp. 254-270, 2002.
[3] R. Heydt and S. Chhokar, "*Refreshable Braille Display Based on Electroactive Polymers*", Proc. 23rd Intl. Display Research Conf., Phoenix, Ariz., 15-18 Sep. 2003.
[4] H. Prahlad et al., "*Programmable Surface Deformation: Thickness-Mode Electroactive Polymer Actuators and their Applications*", Proc. SPIE's Conference on Smart Structures and Materials, 5759, Vol. 102, 2005.

SUMMARY OF THE INVENTION

The invention relates to a Method for driving a matrix of elements responding to the absolute value of the activation voltage avoiding crosstalk according to claim 1, and to an apparatus according to claim 8. Preferred embodiments of the method and of the apparatus are defined in the dependent claims.

In the proposed method the matrix is composed of a set of elements (e.g., dielectric elastomers) arranged in M rows and N columns and having a first and a second electrodes on which to apply the activation voltage. When at least one selected element of the matrix, located on a common activation column and on at least one activation row, is to be excited, the method comprises the following column excitation process for said common activation column:

applying a row activation voltage (V3) to the first electrode of all the elements located on the at least one activation row;
applying a column activation voltage (V0) to the second electrode of all the elements located on the common activation column;
applying a common row voltage (V1) to the first electrode of the elements located on all the rows of the matrix except for the at least one activation row;
applying a common column voltage (V2) to the second electrode of the elements located on all the columns of the matrix except for the common activation column.

The column activation voltage (V0) can be considered 0 volts and then the row activation voltage (V3), common row voltage (V1) and common column voltage (V2) are preferably such that $$V_1 = \frac{V_3}{3} \cdot (1+x), \quad V_2 = \frac{2V_3}{3} \cdot (1-x),$$

with V3>V2>V1>V0 and |x| lower that 0.5.

In a preferred embodiment the row activation voltage (V3), column activation voltage (V0), common row voltage (V1) and common column voltage (V2) are such that |V3−V2| is substantially equal to |V2−V1| and substantially equal to |V1−V0|.

The method can further comprise successively carrying out the column excitation process for all the columns of the matrix.

The time employed between two successive column excitation processes can be lower than 20 µs, and the frequency of carrying out the column excitation process for all the columns of the matrix is preferably comprised between 10 Hz and 50 Hz.

In accordance with another aspect of the invention, an apparatus for driving a matrix of elements responding to the absolute value of the activation voltage avoiding crosstalk is provided. The matrix is composed of a set of elements (e.g. dielectric elastomers) arranged in M rows and N columns and having a first and a second electrodes on which to apply the activation voltage.

The apparatus comprises:
a high voltage switching circuit for applying voltages to the electrodes of the elements;
a low voltage activation circuit connected to the high voltage switching circuit and configured, when at least one selected element of the matrix located on a common activation column and on at least one activation row is to be excited, for:
applying, through the high voltage switching circuit, a row activation voltage (V3) to the first electrode of all the elements located on the at least one activation row;
applying, through the high voltage switching circuit, a column activation voltage (V0) to the second electrode of all the elements located on the common activation column;
applying, through the high voltage switching circuit, a common row voltage (V1) to the first electrode of the elements located on all the rows of the matrix except for the at least one activation row;

applying, through the high voltage switching circuit, a common column voltage (V2) to the second electrode of the elements located on all the columns of the matrix except for the common activation column.

The column activation voltage (V0) can be 0 volts and the row activation voltage (V3), common row voltage (V1) and common column voltage (V2) are such that $$V_1 = \frac{V_3}{3} \cdot (1+x), V_2 = \frac{2V_3}{3} \cdot (1-x),$$

with V3>V2>V1>V0 and |x| lower that 0.5.

The row activation voltage (V3), column activation voltage (V0), common row voltage (V1) and common column voltage (V2) are preferable such that |V3−V2| is substantially equal to |V2−V1| and substantially equal to |V1−V0|.

The low voltage activation circuit is preferably connected to the high voltage switching circuit via optocouplers.

The apparatus can further comprise a reference voltages generator for generating the row activation voltage (V3), column activation voltage (V0), common row voltage (V1) and common column voltage (V2).

The reference voltages generator comprises a main supply voltage source and a resistor voltage divider, which in turn comprises a plurality of resistors, each one in charge of setting the reference to a PNP transistor and to a NPN transistor, in an emitter follower configuration, with both emitter together as output voltage.

The apparatus can further comprise:

for each row of the matrix, a row terminal set block controlled by a row set control signal for applying the row activation voltage (V3);

for each column of the matrix, a column terminal set block controlled by a row set control signal for applying the column activation voltage (V0);

a rows terminal reset block controlled by a rows reset control signal for applying the common row voltage (V1);

a columns terminal reset block controlled by a columns reset control signal ($V_{RC}$) for applying the common column voltage (V2).

BRIEF DESCRIPTION OF THE DRAWINGS

A series of drawings which aid in better understanding the invention and which are expressly related with an embodiment of said invention, presented as a non-limiting example thereof, are very briefly described below.

DESCRIPTION OF A PREFERRED EMBODIMENT OF THE INVENTION

To achieve the above and other objects, the present invention employs principles and techniques whereby a dielectric elastomer matrix can be successfully driven, for some matrix applications, independent of the size of the matrix. Of course, there are practical limits of equipment, costs, etc., that limit the size of the matrix, but, for one embodiment of driving a matrix according to the present invention, the size is not limited by the crosstalk.

In accordance with one aspect of the present invention there is provided a method for driving a dielectric elastomer matrix composed of dielectric elastomer actuators arranged in rows and columns.

Figure 1A:
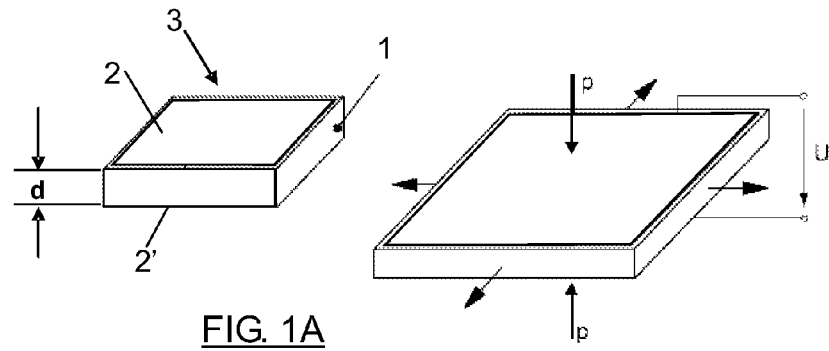
FIGS. 1A and 1B represents the working principle of a dielectric elastomer actuator, according to the prior art.
Figure 1B:
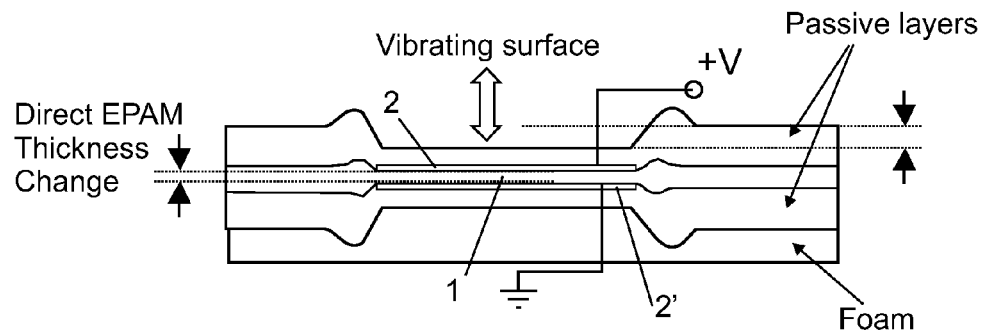

The working principle of a dielectric elastomer 3 actuator is shown in FIGS. 1A and 1B. When a high DC voltage U is applied, a thin dielectric elastomer film 1, sandwiched by a first 2 and a second 2' compliant electrodes, expands in planar directions due to a pressure p in the thickness direction induced by an electric field. When the voltage is switched off, the film regains the original shape. This effect can create, for instance, tactile feelings in a small area of the skin surface (the application area) when the elastomer matrix is applied or fixed to a human body, preferably in a sensitive region (e.g, the abdomen or the lower part of the back).

Assuming that the volume remains constant, the effective pressure is:

$$p = E_r E_0 U/d$$

where $E_r$ is the relative permittivity of the elastomer, $E_0 = 8854 \cdot 10^{12}$ As/Vm is the permittivity in vacuum, U is the applied voltage and d is the thickness of the elastomer film at rest position. The pressure increases quadratically with the electrical field and thus it is the main relationship governing the actuator response. It is important to remark that the elastomer behavior is the same independently of the sign of applied voltage U.

The electrical equivalent model for an elastomer element is a parallel capacitor/resistor configuration, where the capacitance is the result of the two compliant electrodes on the elastomer film, and the resistance is the losses resistance originated by the conductivity of the elastomer film.

The thickness-mode actuation technique is a recent embodiment of EPAM (Electroactive Polymer Artificial Muscle). In this embodiment, the "active" polymer film is bonded or coated with a thicker passive layer, such that changes in the polymer thickness during actuation of the EPAM device are at least partially transferred to the passive layer. The passive layer can be considered passive relative to the polymer film in that it does not respond to the application of an electric field by changing in area or thickness as does the EPAM layer. Nevertheless, the passive layer is coupled to the EPAM film, so that area and thickness changes in the EPAM film induce shearing forces in the passive layer that change the thickness of that layer. Therefore, the change in thickness in the passive layer can be used to amplify, in absolute terms, the displacement produced by the change in thickness of the EPAM polymer film. A schematic diagram of this type of device and the results of shear-mode actuation are shown in FIG. 1A. EPAM undergoing shear-mode actuation is shown in FIG. 1B, which shows a schematic diagram of proposed shear-mode device.

Figure 2A:
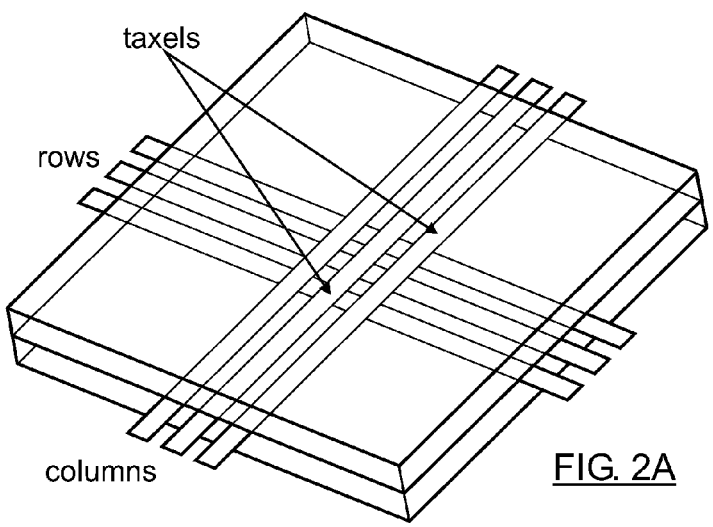
FIGS. 2A and 2B shows a schematic illustration of dielectric elastomer elements in a matrix disposition (elastomer matrix).

In an elastomer matrix, a set of dielectric elastomers arranged in columns and rows, a single element is excited by applying voltage between the column and the row crossing on that element. Each taxel has two electrodes, each electrode at a different side of the dielectric (one electrode 2 is located on the rows and the other electrode 2' forms part of the columns, as shown schematically in FIG. 2A, which represents a 3×3 elastomer matrix). The intersection of columns and rows defines each taxel. Due to the equivalent capacitance-resistance on each element, excitation of one element implies crosstalk excitation on the rest of the element on the matrix. For matrix M×N, M<=N, where N and M are large (more than 10) this crosstalk excitation is close to 50% of the applied voltage for the elements on the row and column involved on the element excitation, and to 1/M for the rest of the elements. Thus, if either N or M is large, the crosstalk excitation on the rest of the elements which are not located in the same column and row is largely reduced. But it is increased to close to 50% on involved rows and columns.

Figure 2B:
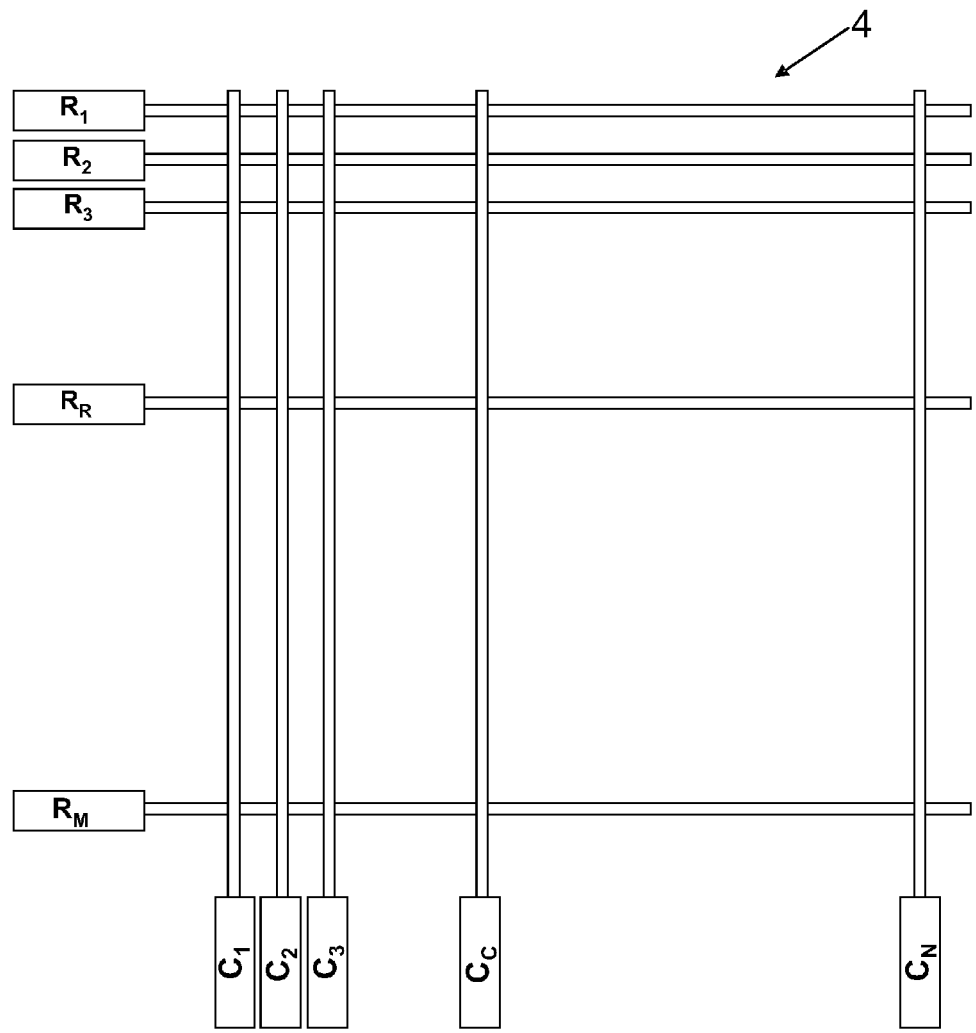

FIG. 2B is a schematic illustration of dielectric elastomer elements in an M-row by N-column matrix. The lines in FIG. 2 represent conductive wires connecting the electrodes of each elastomer taxel, whereas the boxes ($R_1$, $R_2$, $R_M$; $C_1$, $C_2$, $C_N$) represent connection terminals. First 2 and second 2' electrodes are located where files and columns cross each other.

Applied voltage (+U) to row R ($R_R$) and column C ($C_C$) will excite the element on the crossing point of those row and column. The same excitation will be produced if a voltage (−U) is applied. If the rest of the rows and columns are floating (with no voltage applied, open circuit), there will be a crosstalk coupling to the rest of the elements.

To avoid this crosstalk a bias voltage is introduced to all the elements of the matrix in the way that the interference will match this bias voltage with changed sign. This bias voltage will also help to drive the elastomer with smaller voltage changes than in the case no bias is used with almost no mechanical response losses.

Figure 3:
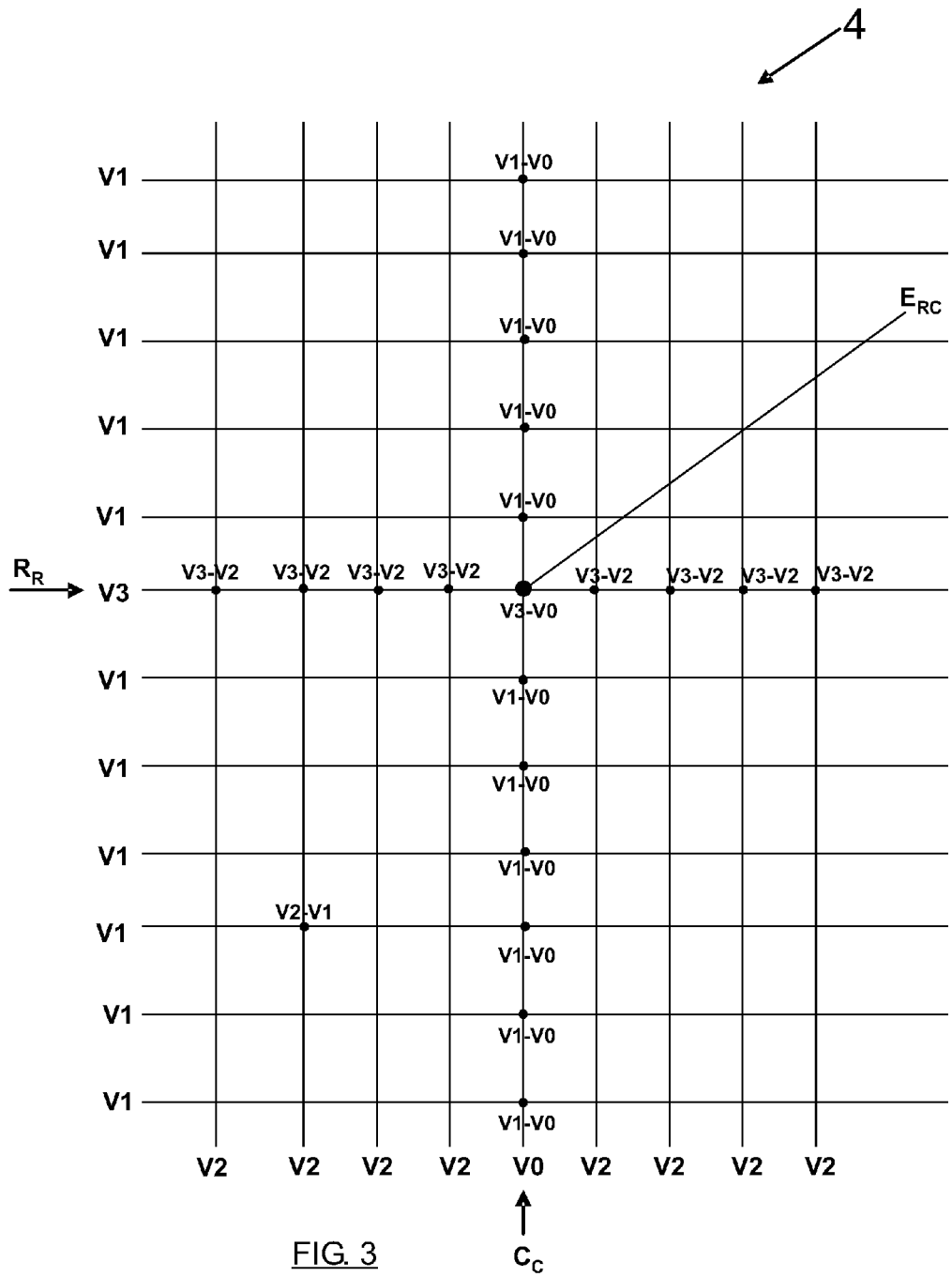
FIG. 3 depicts a schematic illustration of the application of a bias voltage to the elements of an elastomer matrix, and different voltages to a concrete row R and column C.

If every row is connected to a common row voltage V1 and every column to a common column voltage V2, the bias voltage on each element will be (V2−V1). To excite an element $E_{RC}$ of the matrix 4, voltage on row R ($R_R$) and column C ($C_C$) must be changed. The row R ($R_R$) is applied a row activation voltage V3 and the column C ($C_C$) a column activation voltage V0, as it is represented in FIG. 3.

Figure 4:
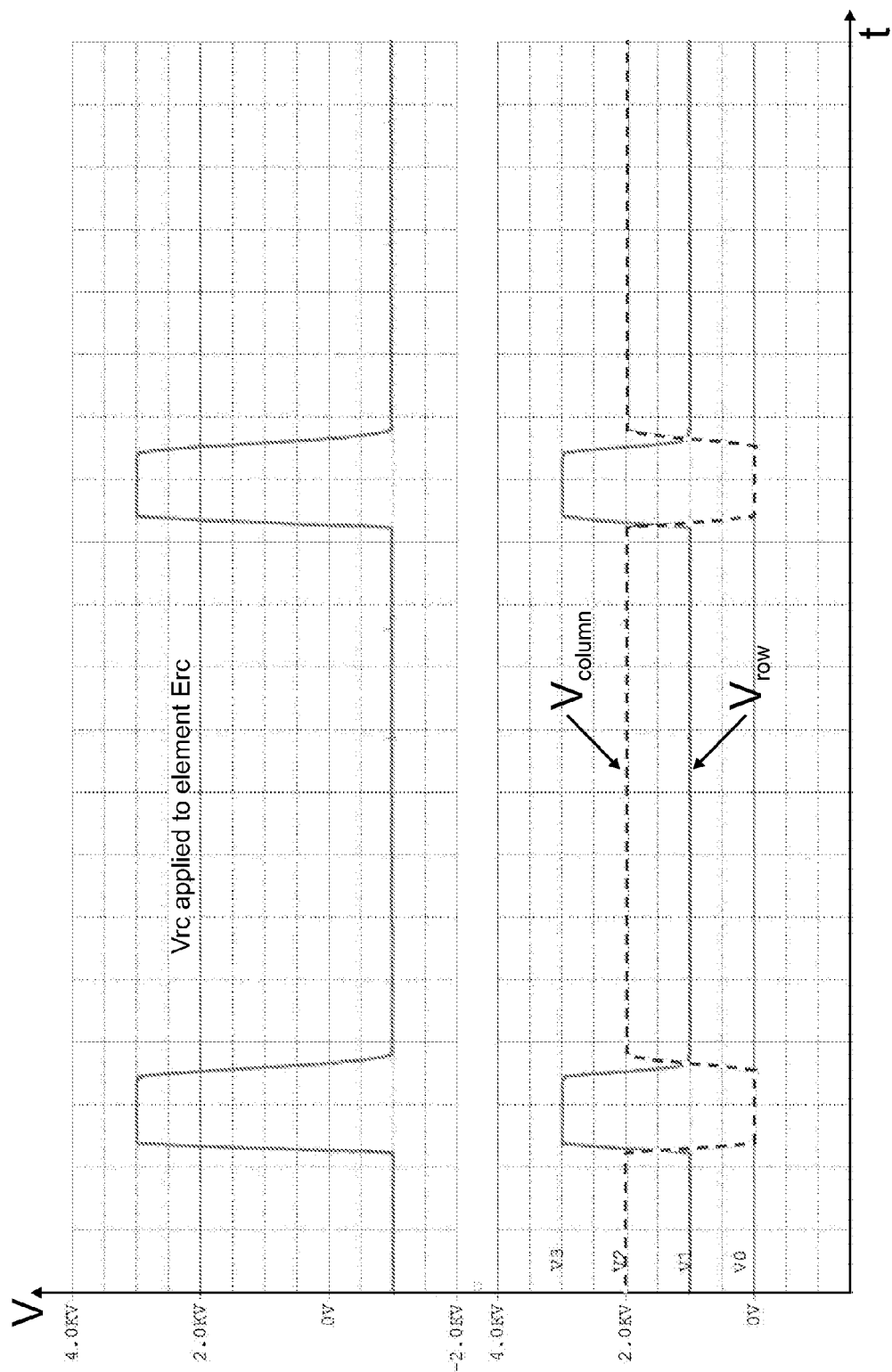
FIG. 4 shows, for the example depicted in FIG. 3, the voltage graphic applied to the element $E_{RC}$ (row R, column C) of the matrix.
Figure 5:
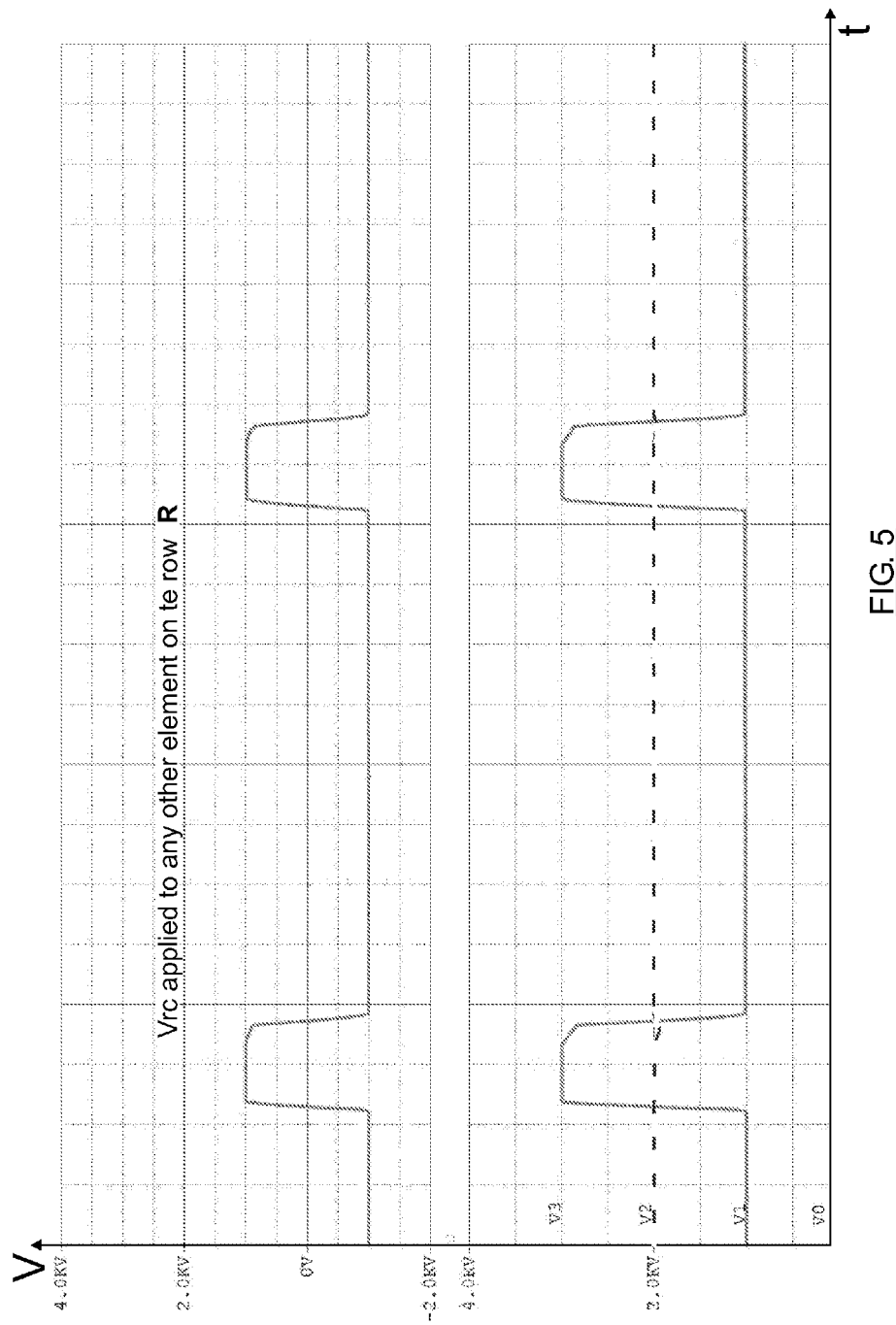
FIG. 5 shows, for the example depicted in FIG. 3, the voltage graphic applied to the rest of the elements of the row R of the matrix.
Figure 6:
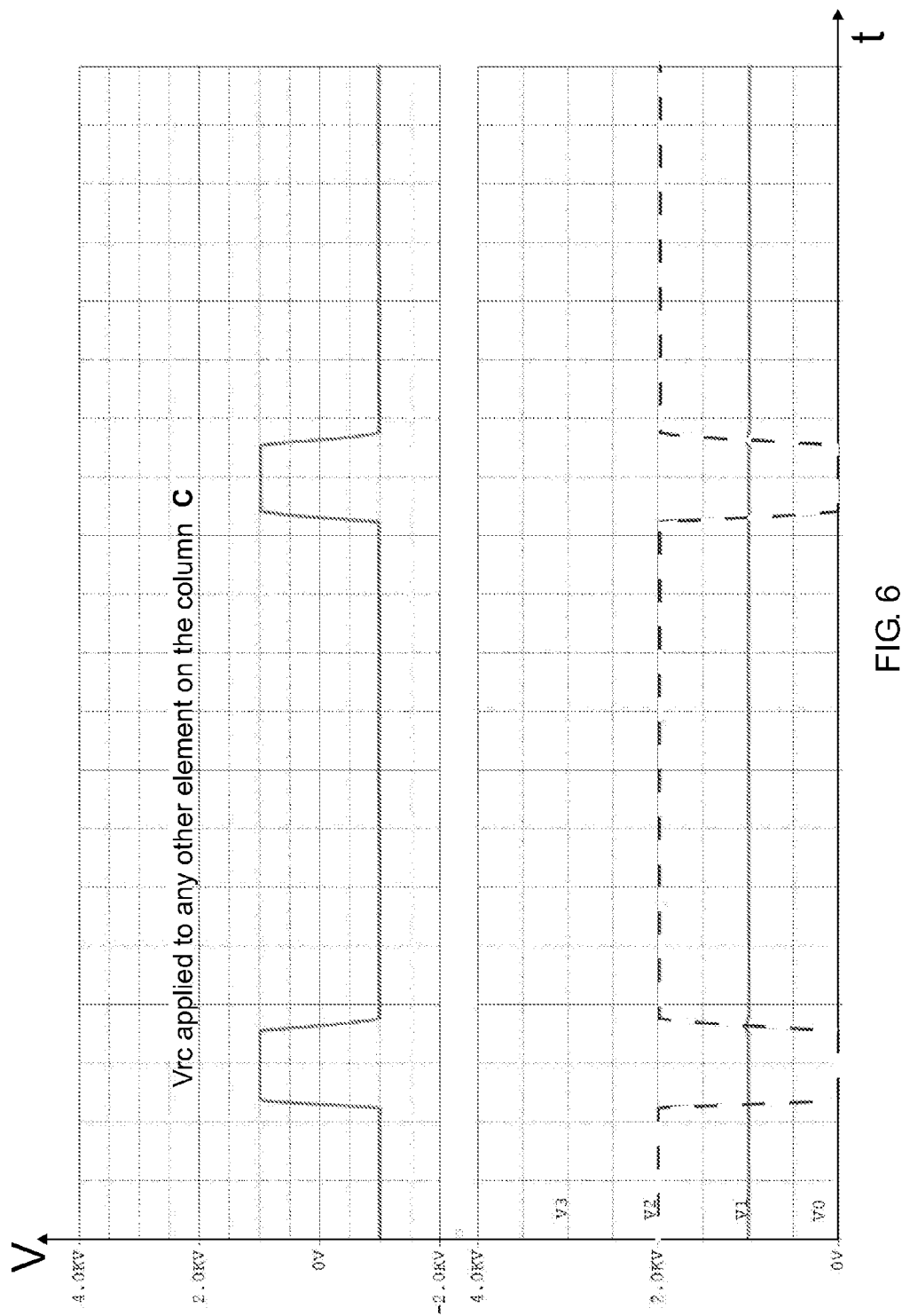
FIG. 6 shows, for the example depicted in FIG. 3, the voltage graphic applied to the rest of the elements of the column C of the matrix.

For row R ($R_R$) and column C ($C_C$) the voltage on that element $E_{RC}$ will be (V3−V0), as shown in FIG. 4. The voltage on the rest of the elements of the row R ($R_R$) will be (V3−V2), as shown in FIG. 5. The voltage on the rest of elements of the column C ($C_C$) will be (V1−V0), as shown in FIG. 6. The broken line in lower graphics of FIGS. 4, 5 and 6 represents the voltage applied to the columns (V0 is the column activation voltage), whereas the continuous line in lower graphics is the voltage applied to the rows (V3 is the row activation voltage). In said FIGS. 4, 5 and 6 the upper graphic represents the voltage resulting from the difference between the voltage applied on the rows ($V_{row}$), continuous line, and the voltage applied to the columns ($V_{column}$), broken line, in the lower graphic. The upper graphic of FIG. 4 represents the resulting voltage applied to the activated taxel (element $E_{RC}$), the upper graphic in FIG. 5 is the resulting voltage applied to the rest of the elements in the same row R, and the upper graphic in FIG. 6 is the resulting voltage applied to the rest of the elements in the same column C.

Choosing the voltages (V1−V0) equal to (V2−V1) and equal to (V3−V2) will allow elements excitation with cero crosstalk, as the induced voltage on the not-targeted elements will only change on sign, but not in magnitude, producing no variation on the elastomer mechanical condition. On FIGS. 4, 5 and 6 the voltages chosen are, as an example: V0=0 kV; V1=1 kV; V2=2 Kv; V3=3 kV.

As shown on FIGS. 5 and 6, there is no change on the elastomer condition as the applied voltage goes from +1 kV to −1 kV, which is the resulting applied voltage on the rest of the elements of column C (FIG. 6) and on the rest of the elements of row R (FIG. 5).

As the mechanical response is proportional to the square of the applied voltage, with a bias of 1 kV and active voltage of 3 kV, the mechanical response ratio from bias to active will be off 9 to 1, and thus the mechanical response to the excitation on an element $E_{RC}$ of the elastomer matrix 4 can be easily felt by the user (in the case of tactile stimulations).

Figure 7:
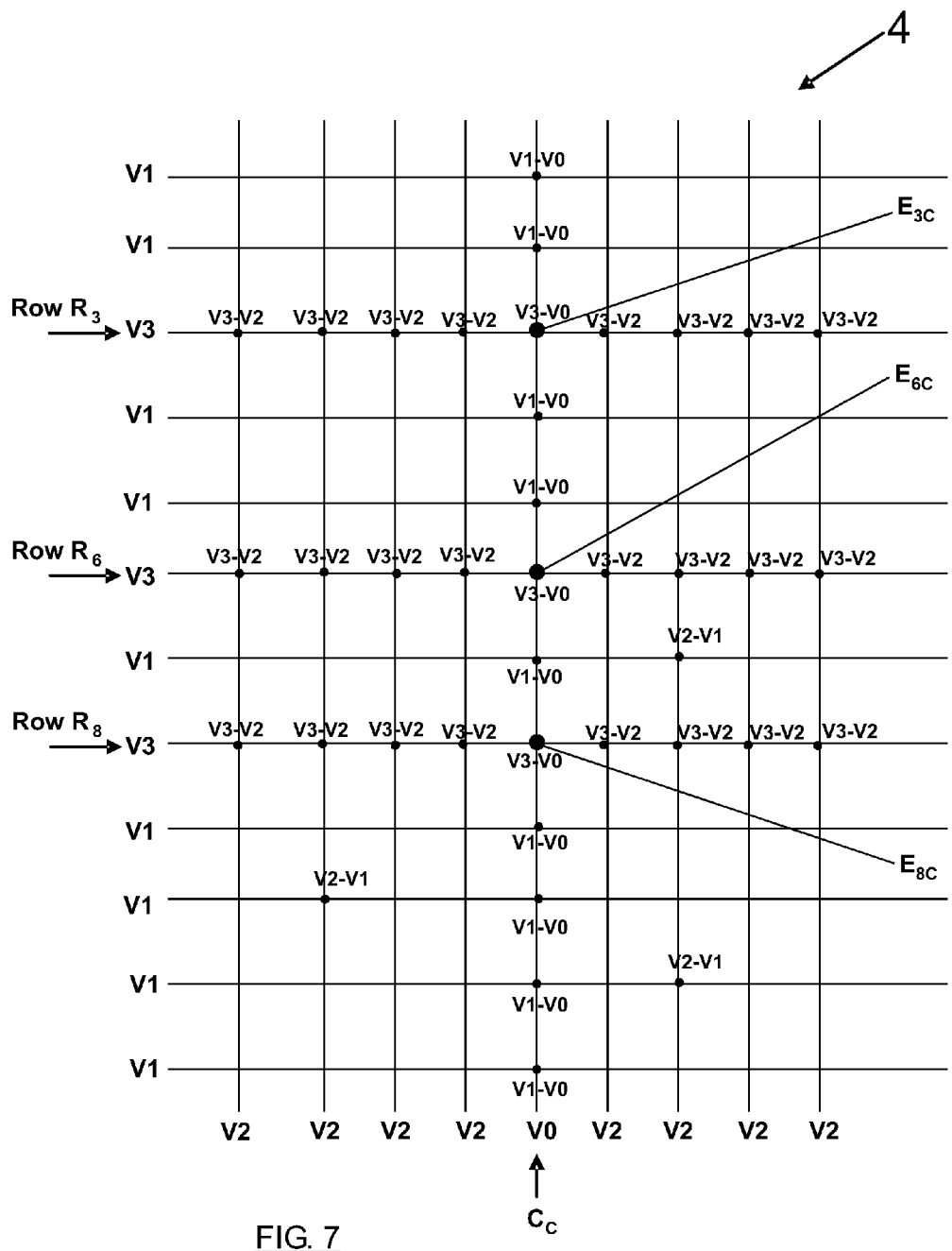
FIG. 7 shows an example for simultaneously activating different elements of a column C of the elastomer matrix.

With this technique, several elements on the same column (or row) can be activated on the same time, allowing to activate the complete matrix of M×N on M steps (or N steps). Thus, there are N columns of which only one is driven at a time and there are M rows of which j (j<=M) are driven simultaneously. Likewise, the matrix could be rotated 90 degrees and one row would be driven at a time with multiple columns. To activate several elements on a concrete column ($E_{3C}$,$E_{6C}$,$E_{8C}$), the procedure will be the following: to activate (apply a voltage V3 to) all the rows containing the elements that are going to be active (in the example show in FIG. 7, activation rows $R_3$, $R_6$ and $R_8$), and at the same time activate (apply a voltage V0) the selected common activation column ($C_C$). Thus, elements $E_{3C}$, $E_{6C}$ and $E_{8C}$ are activated at a time. After activating the chosen elements located in a common activation column ($C_C$), elements in other chosen elements in column $C_{C+1}$ (or in any other selected column, it is not necessary that the columns are activated consecutively in increasing order) will be activated, and so on till all the columns of the matrix have been activated, the full matrix being then fully activated. Time elapsed between consecutive column activations depend on the size and response time of the taxels, the electronic would normally permit activation times from 15 to 20 µs. The width of the activating pulse depends on the taxel response. Typically the width of the applied pulse can be 1000 µs, since it produces more vibrating effect than that produced by longer pulses. The width of the pulse can be chosen according to the application, normally lower than 20 µs.

As commented before, choosing the voltages |V1−V0| equal to |V2−V1| and equal to |V3−V2| will allow elements excitation with cero crosstalk. However, if some background activation of the not targeted taxels is desired (for instance, in a tactile visual system a residual constant vibration close to the human perception threshold could be useful to increase the tactile sensibility), selection of V1 and V2 offset from the non crosstalk condition (V1−V0) equal to (V2−V1) and equal to (V3−V2) will lead to some residual activation of the rest of the taxels. For example by choosing V1=⅓*V3*(1+x) and V2=⅔*V3*(1−x) with 0<x<0.5, will create a residual activation with 10% V3 voltage when x=0.1.

As V0 can always be considered the ground reference, V0=0. In the case that x=0, the complying condition would be $$V_1 = \frac{V_3}{3}, V_2 = \frac{2V_3}{3},$$

with V3>V2>V1>V0.

If x·0, the resulting condition would be $$V_1 = \frac{V_3}{3} \cdot (1+x), V_2 = \frac{2V_3}{3} \cdot (1-x)$$

with V3>V2>V1>V0.

By applying short pulses (around 1000 us) to the taxels (vary depending on taxel mechanical response) we can reinforce the stroke sensation as perceiver on the skin. Based on the taxel mechanical response a pulse width can be chosen to sum the activation and deactivation strokes of the taxel and reinforce on this way the perception.

In accordance with a further aspect of the present invention there is provided a voltage generating apparatus to drive the matrix according to the above commented method. Reference voltages and connection switches to those voltages are needed. The voltage generating apparatus comprises two circuits, the high voltage switching circuit and the reference voltages generator used by the switching circuit.

One of the problems of working with high voltages is that even for very low polarization of activation circuit currents, power losses are considerable. To avoid this optocouplers are used, keeping separates in this way the high voltage switching circuit from the low voltage activation circuit.

Figure 8:
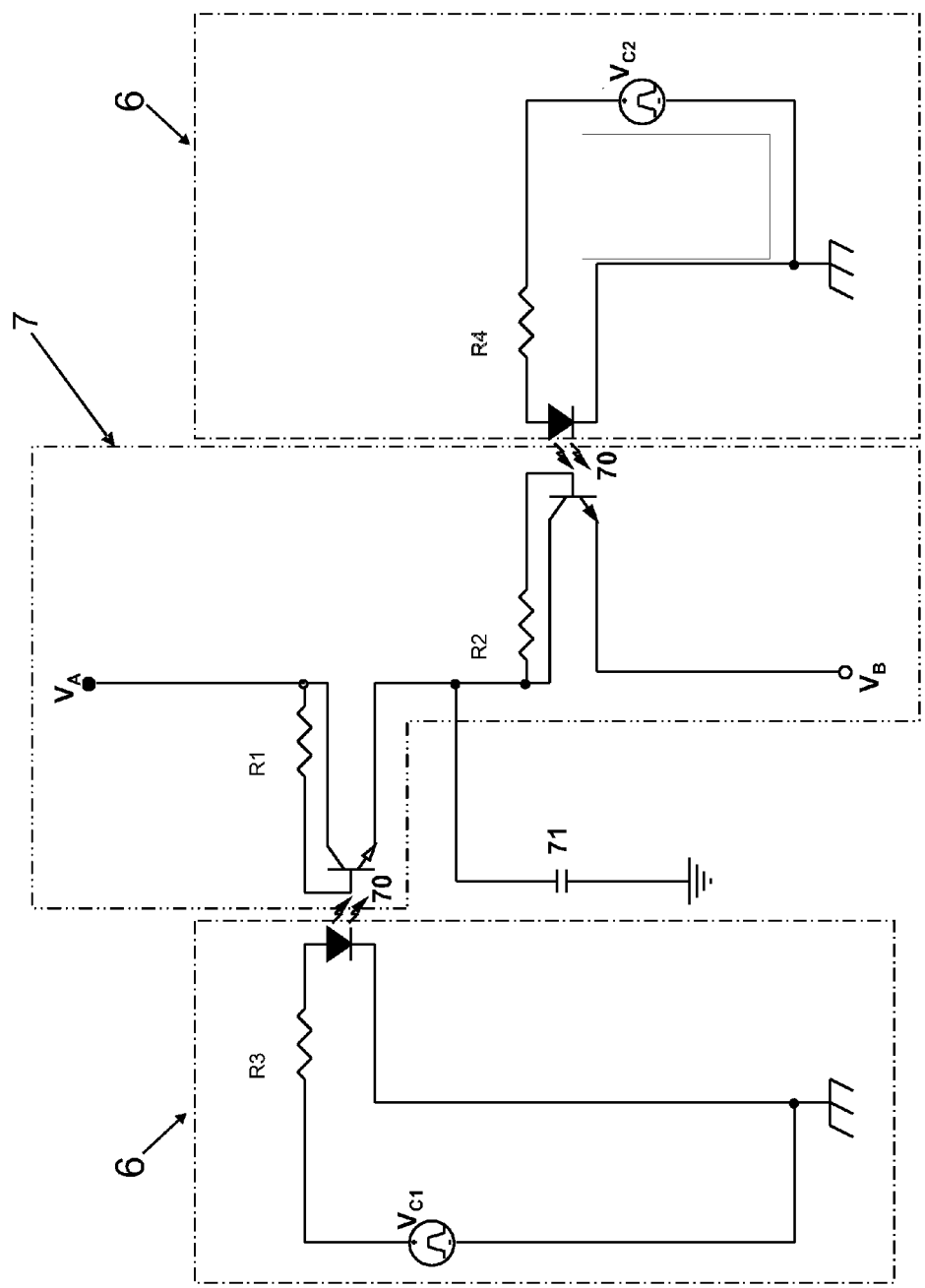
FIG. 8 shows a basic switching scheme for a voltage generating apparatus driving the elastomer matrix.

The circuit in FIG. 8 represents the basic switching scheme, where one of the terminals of a load (e.g., a taxel) can be electrically connected either to $V_A$ or to $V_B$ ($V_A$ and $V_B$ can be any voltage V0, V1, V2, V3), based on the control signals $V_{C1}$ and $V_{C2}$. Optocouplers 70, can be used on this particular application. Resistors R1 and R2 discharge rapidly the base of the output transistor to allow fast switching.

Optocouplers 70 support maximum output voltages on the range of 400V, while in our application voltages in the order of 2000V are needed (see FIG. 4). Signals to activate the taxels on the elastomer matrix are low current, only the current needed to charge the equivalent capacitor 71 of the taxel, which is around 1 pF.

These characteristics allow using several optocouplers 70 in series to get the desired high voltage of 2000V, with each transistor at the output of the optocouplers 70 acting as a zener device when voltages approach breakdown values, as long as the current through it is small enough to keep the device within the rated power dissipation values.

In the case of the device used on this application, the MOC8204, the rated maximum power dissipation is 300 mW what leads to values in the order of 600 uA for the average current the device can handle in limiting voltage situation (500V considered here).

Figure 9A:
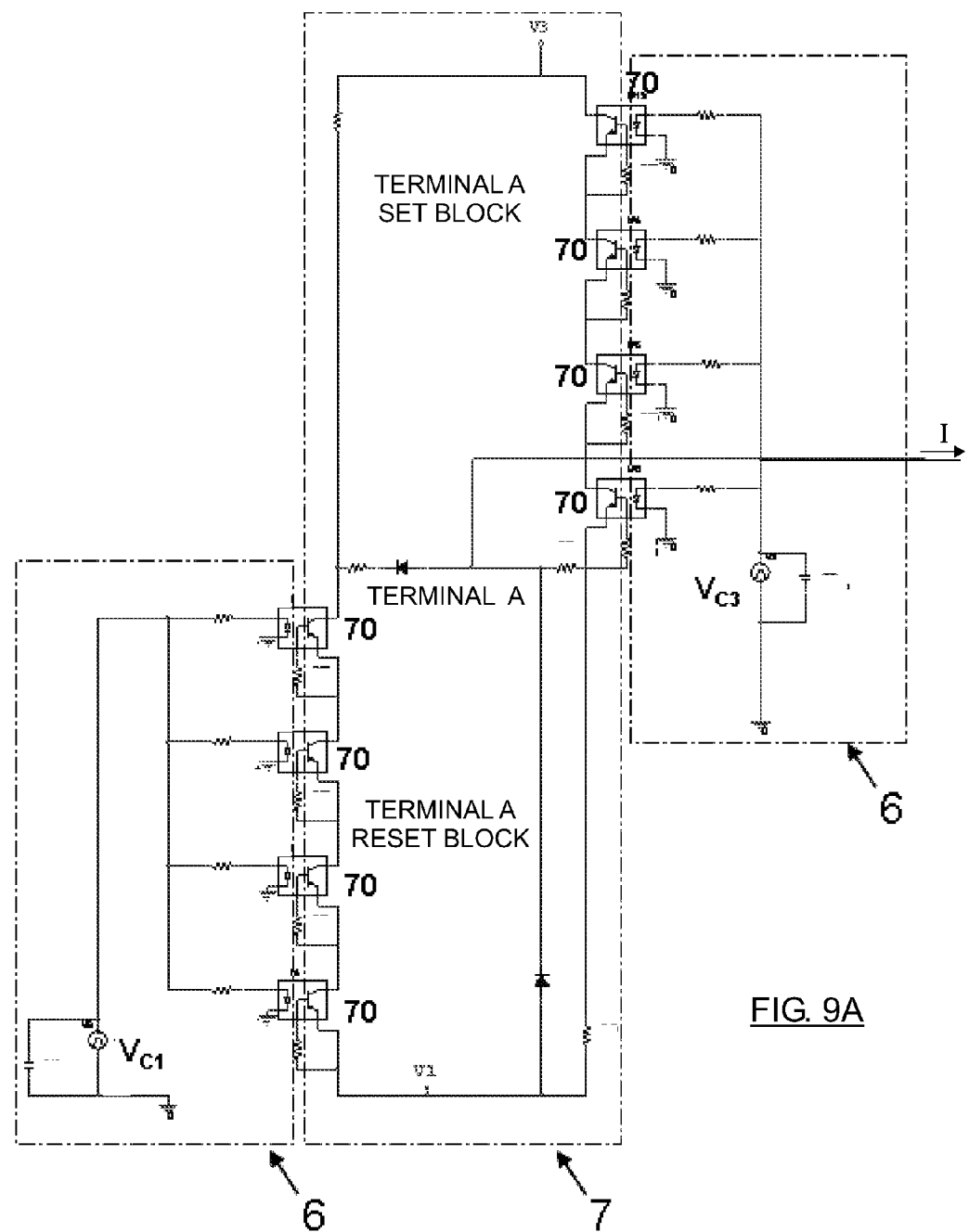
FIGS. 9A and 9B represent the schematic diagram for one single taxel activation.
Figure 9B:
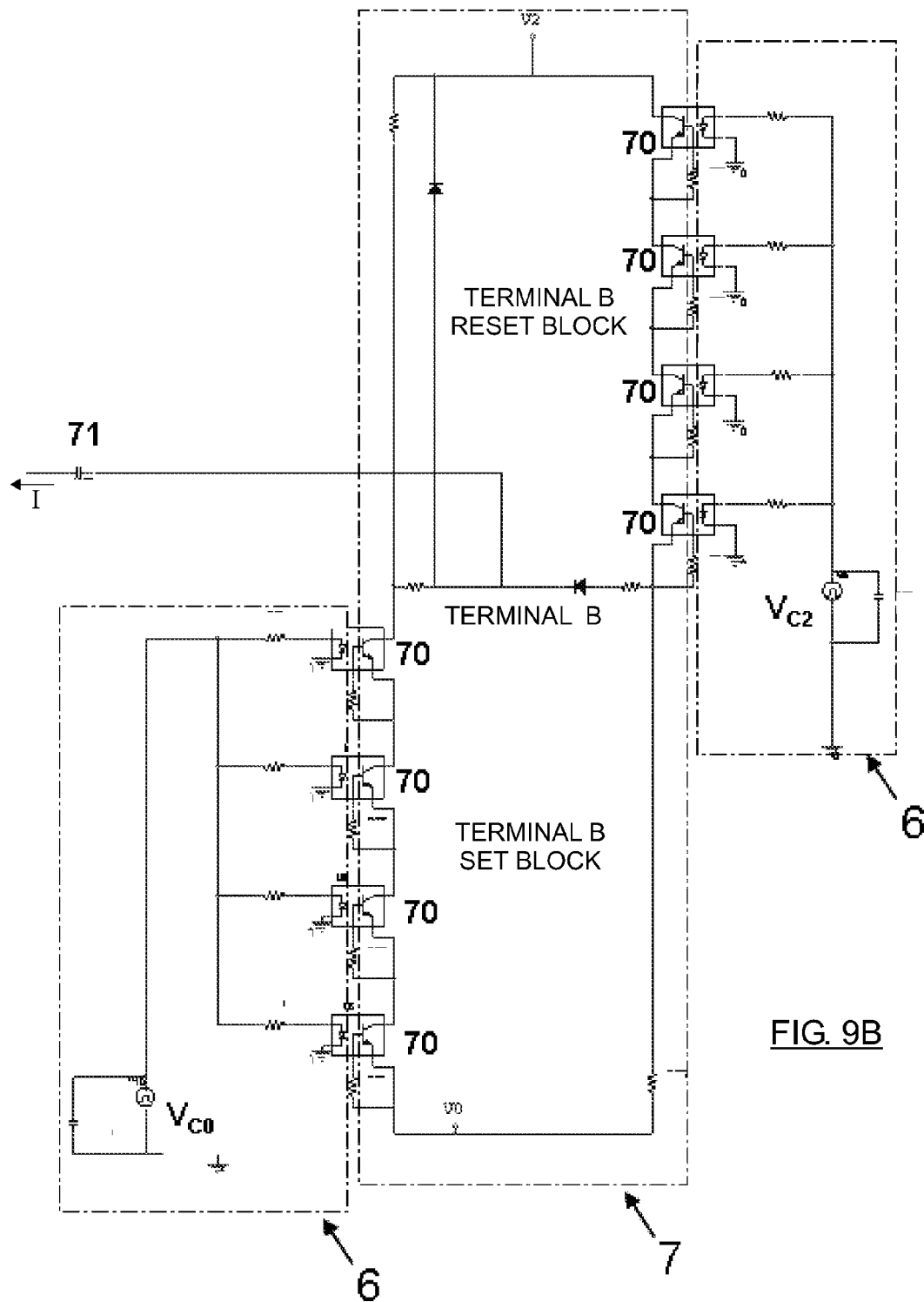

In FIGS. 9A and 9B it is represented the schematic diagram for one single taxel activation (both figures are divided on line I, because of the size), where voltages V3 and V1 can be applied to terminal A of the elastomer and voltages V2 and V0 can be applied to terminal B of the elastomer (taxel load terminals A and B are the compliant electrodes (2,2') of the elastomer represented in FIG. 1; voltages on rows are applied to first compliant electrode 2, and voltages on columns are applied to the second compliant electrode 2', or viceversa), represented by a capacitor 71 on the schematic. The reset control signals ($V_{C1}, V_{C2}$) are in charge of the reset of the terminals A and B of the elastomer, whereas the set control signals ($V_{C0}, V_{C3}$) are in charge of the set of the terminals A and B.

On terminal A side, polarization resistors R30 and R49 set the idle state for the optocouplers 70 when are not activated. Resistor R49 is setting the terminal A to V1 by default. Diode D19 keeps the terminal A reset block isolated from the circuit unless they are activated. Diode D20 prevents terminal A to go under V1 voltages. Resistors R50 and R51 limit the maximum current through the optocouplers 70. Similarly on terminal B side (resistor R36 is setting the terminal B to V2 by default, etc).

Resistors between emitter and base terminals on the output transistors of the optocouplers speed up the discharging time of the base, allowing fast switch off time of the transistor.

Switching time of 15 us for voltages from −1 kV to +3 kV (a variation of 4 kV) are achieved. The power loss is minimize to the losses on the polarization resistors only when the optocouplers are active.

V0, V1, V2, and V3 are the reference voltages, where (V1−V0)=(V2−V1)=(V3−V2) and equal to ⅓ of total voltage V3 (when V0=0). To get these reference voltages from a main supply voltage Vcc, a low losses divider circuit is introduced as part of the invention.

Figure 10:
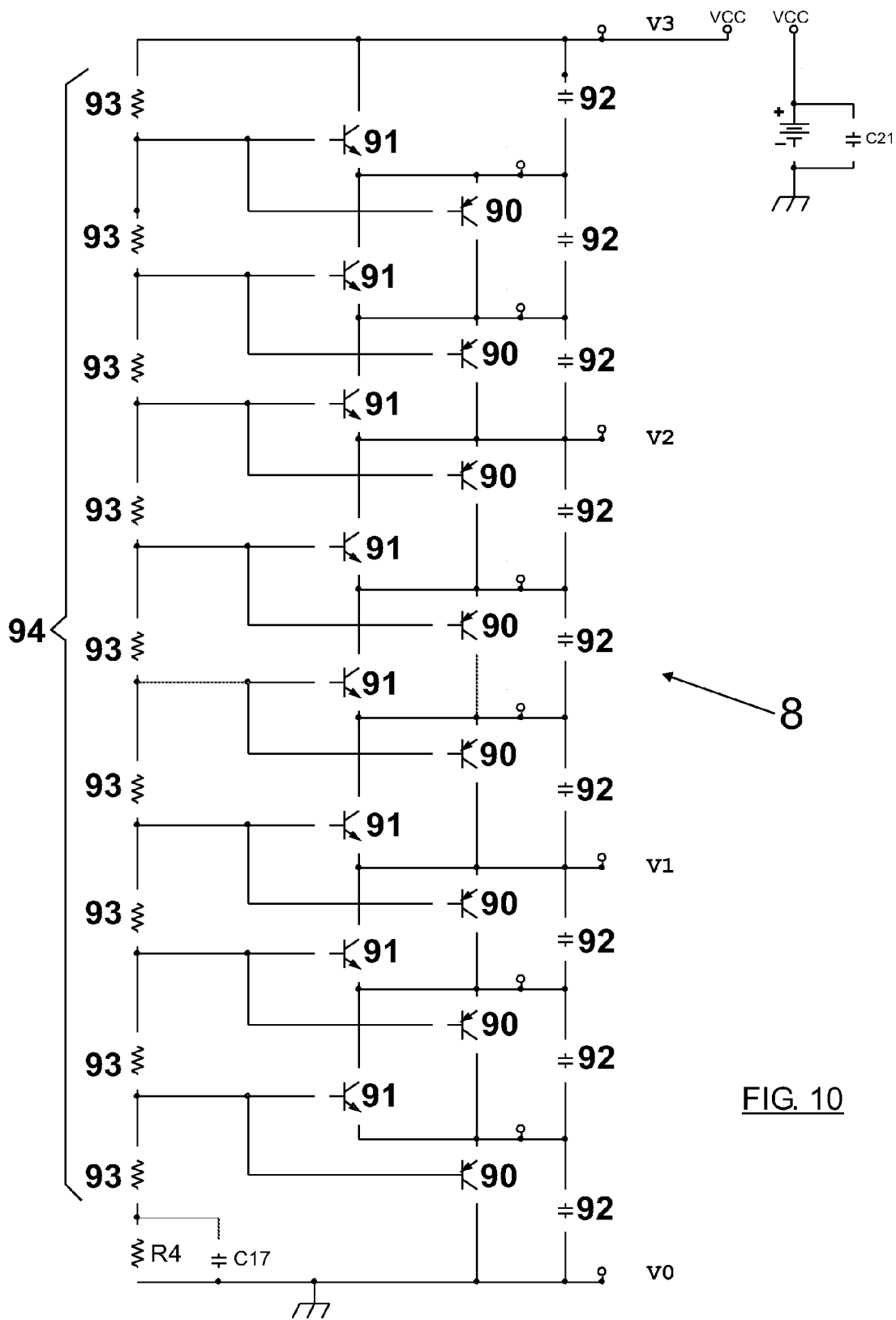
FIG. 10 shows an example of reference voltage generator used in the voltage generating apparatus driving the elastomer matrix.

The reference voltage generator is form by a low current, high resistive value, resistor voltage divider 93 to feed a reference voltage to a chain of transistor low impedance output stage, as shown in FIG. 10.

The resistor voltage divider (94), composed of different resistors 93 (in the example of 10 MΩ), set the reference to two transistors, a PNP transistor 90 and a NPN transistor 91, in an emitter follower configuration, with both emitters together as output voltage. As transistors with maximum $V_{ceo}$ voltage in the range of 400V are used, a series of this basic block is repeated to achieve the desired high voltage. Resistor R4 in parallel with capacitor C17 is used to sample and lowpass filter the total voltage.

If the emitter output voltage trends to go above the input reference voltage, the PNP transistor 90 get polarized and a current thru the collector will keep the output voltage following the input reference. Similarly, if the emitter output voltage trends to distant bellow the input reference voltage, the NPN transistor get polarized and a current thru the collector will keep the output voltage following the input reference.

This collector current will make a chain reaction with similar response on the rest of the blocks. The capacitors 92 at the output are use to store energy between taxels activation pulses, absorbing the current peak demand of voltage pulses on the taxels. Output voltages V0, V1, V2 and V3 are the reference voltages shown in FIGS. 3 to 9.

Figure 11A:
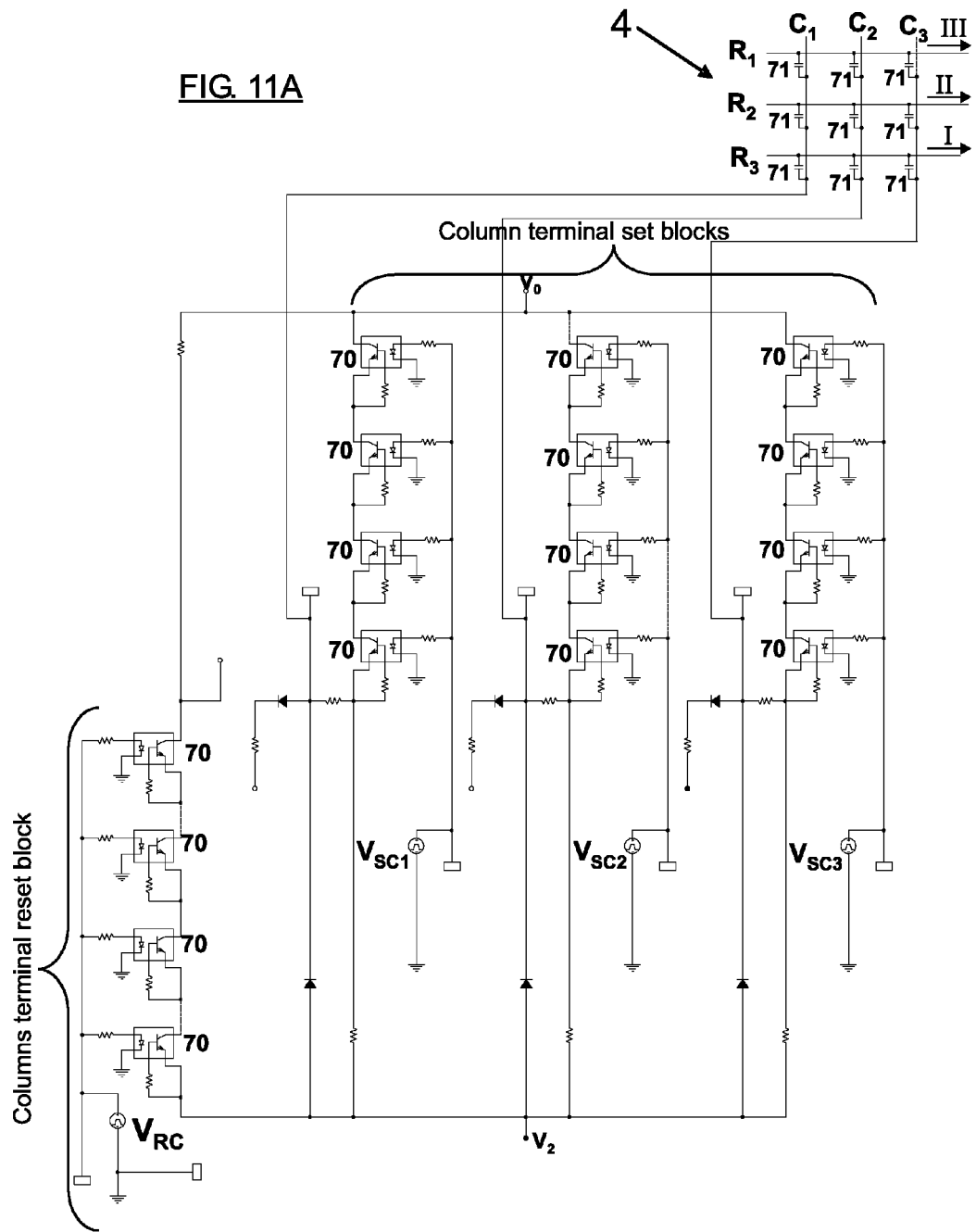
FIGS. 11A and 11B represent, as an example, the driving circuit for a 3×3 elastomer matrix.
Figure 11B:
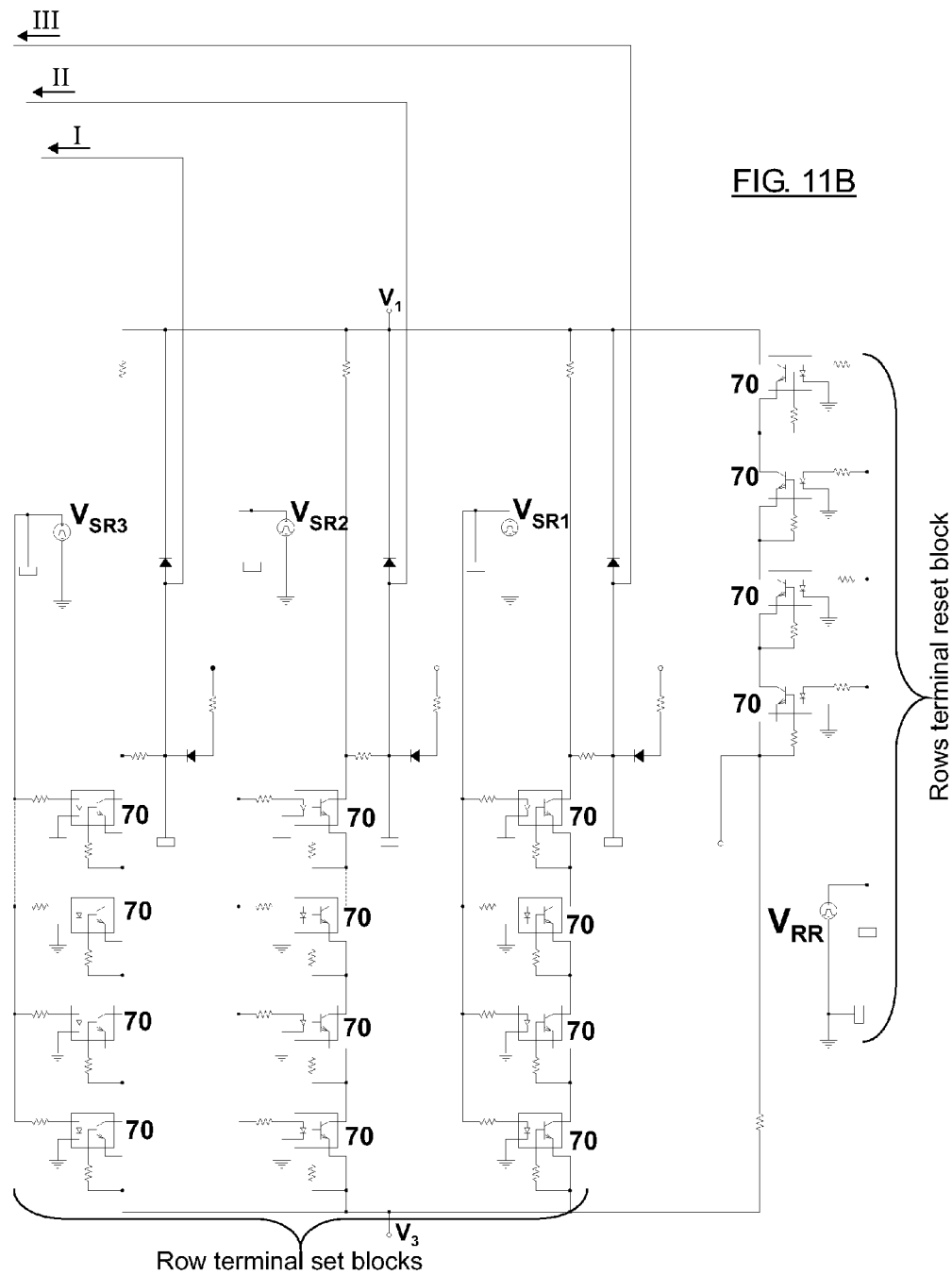

As the circuit is scaled to activate bigger matrix, the reset block can be common to all the set blocks per terminal, reducing the size of the complete circuit. A nine taxels driving circuit for a 3×3 matrix is represented on FIGS. 11A and 11B (both figures are divided on line I, II and III, because of the size). Here on each terminal the reset block is shared with all the set blocks, as the reset block is isolated from the circuit by a diode, and all of the set blocks will be active at the same time, this common reset block will bring the terminal X signal to the initial value thru the diode once the set blocks are deactivated.

In order to activate or set determined columns, several column set control signals ($V_{SC1}, V_{SC2}, V_{SC3}$) are provided, as many as the number of columns. Similarly, in order to activate the rows, there are several row set control signals ($V_{SR1}, V_{SR2}$, $V_{SR3}$), as many as the number of rows. Therefore, to activate the row i, $R_i$ and the column j, $C_j$, setting control signals $V_{SRi}$ and $V_{SCj}$ must be activated. Besides, and as it has been described in FIG. 7, several rows can be activated at a time while activating a certain column. A reset control signal is provided for each terminal: a columns reset control signal ($V_{RC}$) for resetting the columns (applying the common column voltage V2) and a rows reset control signal ($V_{RR}$) for resetting the rows (applying the common row voltage V1). Reset and set signals cannot occur at the same time, even more, to reduce power consumption a small discharge time for the output transistors on the optocoupler must be introduced between the deactivation of the set signal and the activation of the reset signal.

In a preferred embodiment a matrix of 100×100 taxels can be activated such that the time to activate consecutive columns is comprised between 200 μs-1000 μs, so that the time to activate the full matrix would be around 20 ms-100 ms (a frequency of 10 Hz-50 Hz).

The invention claimed is:

1. Method for driving a matrix of elements responding to an absolute value of an activation voltage avoiding crosstalk, the matrix comprising a set of elements arranged in M rows and N columns and having a first electrode and a second electrode on which to apply the activation voltage, wherein at least one selected element of the matrix located on a common activation column and on at least one activation row is to be excited, the method comprises the following column excitation process for said common activation column:
   applying a row activation voltage to the first electrode of all the elements located on the at least one activation row;
   applying a column activation voltage to the second electrode of all the elements located on the common activation column;
   applying a common row voltage to the first electrode of the elements located on all the rows of the matrix except for the at least one activation row;
   applying a common column voltage to the second electrode of the elements located on all the columns of the matrix except for the common activation column.

2. A method according to claim 1, wherein the row activation voltage (V3), column activation voltage (V0), common row voltage (V1) and common column voltage (V2) are such that |V3–V2| is substantially equal to |V2–V1| and substantially equal to |V1–V0|.

3. A method according to claim 1, where the elements of the matrix are dielectric elastomers.

4. A method according to claim 1, further comprising successively carrying out the column excitation process for all the columns of the matrix.

5. A method according to claim 4, wherein the time employed between two successive column excitation processes is lower than 20 μs.

6. A method according to claim 4, wherein the frequency of carrying out the column excitation process for all the columns of the matrix is comprised between 10 Hz and 50 Hz.

7. Apparatus for driving a matrix of elements responding to an absolute value of an activation voltage avoiding crosstalk, the matrix comprising a set of elements arranged in M rows and N columns and having a first electrode and a second electrode on which to apply the activation voltage, the apparatus comprises:
   a high voltage switching circuit for applying voltages to the electrodes of the elements;
   a low voltage activation circuit connected to the high voltage switching circuit and configured, when at least one selected element of the matrix located on a common activation column and on at least one activation row is to be excited, for:
      applying, through the high voltage switching circuit, a row activation voltage to the first electrode of all the elements located on the at least one activation row;
      applying, through the high voltage switching circuit, a column activation voltage to the second electrode of all the elements located on the common activation column;
      applying, through the high voltage switching circuit, a common row voltage to the first electrode of the elements located on all the rows of the matrix except for the at least one activation row;
      applying, through the high voltage switching circuit, a common column voltage to the second electrode of the elements located on all the columns of the matrix except for the common activation column.

8. The apparatus according to claim 7, wherein the row activation voltage (V3), column activation voltage (V0), common row voltage (V1) and common column voltage (V2) are such that |V3–V2| is substantially equal to |V2–V1| and substantially equal to |V1–V0|.

9. The apparatus according to claim 7, where the elements of the matrix are dielectric elastomers.

10. The apparatus according to claim 7, wherein the low voltage activation circuit is connected to the high voltage switching circuit via optocouplers.

11. The apparatus according to claim 7, further comprising a reference voltages generator for generating the row activation voltage, the column activation voltage, the common row voltage and the common column voltage.

12. The apparatus according to claim 11, wherein the reference voltages generator comprises a main supply voltage source and a resistor voltage divider, which in turn comprises a plurality of resistors, each resistor in charge of setting the reference to a PNP transistor and to a NPN transistor, in an emitter follower configuration, with both emitter together as output voltage.

13. The apparatus according to claim 7, further comprising:
   for each row of the matrix, a row terminal set block controlled by a row set control signal for applying the row activation voltage;
   for each column of the matrix, a column terminal set block controlled by a row set control signal for applying the column activation voltage;
   a rows terminal reset block controlled by a rows reset control signal for applying the common row voltage;
   a columns terminal reset block controlled by a columns reset control signal for applying the common column voltage.

* * * * *